United States Patent
McHugh et al.

(10) Patent No.: US 10,494,731 B2
(45) Date of Patent: Dec. 3, 2019

(54) ELECTROPLATING DYNAMIC EDGE CONTROL

(71) Applicant: Applied Materials, Inc., Santa Clara, CA (US)

(72) Inventors: Paul McHugh, Kalispell, MT (US); Gregory J. Wilson, Kalispell, MT (US); Daniel Woodruff, Kalispell, MT (US); Marvin Bernt, Whitefish, MT (US)

(73) Assignee: Applied Materials, Inc., Santa Clara, CA (US)

( * ) Notice: Subject to any disclaimer, the term of this patent is extended or adjusted under 35 U.S.C. 154(b) by 0 days.

(21) Appl. No.: 15/838,009

(22) Filed: Dec. 11, 2017

(65) Prior Publication Data

US 2019/0177869 A1    Jun. 13, 2019

(51) Int. Cl.

| | | |
|---|---|---|
| *C25D 17/00* | (2006.01) | |
| *C25D 7/12* | (2006.01) | |
| *H01L 21/687* | (2006.01) | |
| *C25D 21/12* | (2006.01) | |
| *C25D 5/04* | (2006.01) | |
| *C25D 17/06* | (2006.01) | |
| *H01L 21/288* | (2006.01) | |
| *C25D 17/12* | (2006.01) | |

(52) U.S. Cl.
CPC ............. *C25D 17/007* (2013.01); *C25D 5/04* (2013.01); *C25D 7/123* (2013.01); *C25D 17/001* (2013.01); *C25D 17/002* (2013.01); *C25D 17/06* (2013.01); *C25D 17/12* (2013.01); *C25D 21/12* (2013.01); *H01L 21/2885* (2013.01); *H01L 21/68764* (2013.01)

(58) Field of Classification Search
CPC ........................ C25D 7/12–123; C25D 17/001
See application file for complete search history.

(56) References Cited

U.S. PATENT DOCUMENTS

| | | | |
|---|---|---|---|
| 2006/0070883 A1* | 4/2006 | Bejan ..................... | C25D 17/00 205/118 |
| 2010/0032310 A1* | 2/2010 | Reid ...................... | C25D 21/12 205/261 |
| 2012/0043301 A1 | 2/2012 | Arvin et al. | |
| 2012/0044236 A1 | 2/2012 | Nam et al. | |

(Continued)

*Primary Examiner* — Bryan D. Ripa
*Assistant Examiner* — Ho-Sung Chung
(74) *Attorney, Agent, or Firm* — Kilpatrick Townsend & Stockton LLP (57) ABSTRACT

Embodiments of the present technology may include an electroplating system. The electroplating system may include a vessel. The system may also include a wafer holder configured for holding a wafer in the vessel. The system may further include an anode in the vessel. In addition, the method may include a plurality of thief electrodes. For each thief electrode of the plurality of thief electrodes, a thief current channel may be defined by a channel wall. The channel wall for each thief electrode may define an aperture adjacent to the wafer holder. The thief current channel may extend from each thief electrode to the aperture. The system may include a current control system in electrical communication with the plurality of thief electrodes. The current control system may be configured such that an amount of current delivered to each thief electrode can be adjusted independently.

18 Claims, 9 Drawing Sheets

(56) References Cited

U.S. PATENT DOCUMENTS

2013/0075265 A1    3/2013   McHugh et al.
2016/0215409 A1*   7/2016   Wilson .................... C25D 7/12
2017/0058424 A1    3/2017   Wilson et al.

* cited by examiner

ELECTROPLATING DYNAMIC EDGE CONTROL

BACKGROUND

Microelectronic devices, such as semiconductor devices, are generally fabricated on and/or in wafers or workpieces. A typical wafer plating process involves depositing a seed layer onto the surface of the wafer via vapor deposition. A photoresist may be deposited and patterned to expose the seed. The wafer is then moved into an electroplating processor where electric current is conducted through an electrolyte to the wafer, to apply a blanket layer or patterned layer of a metal or other conductive material onto the seed layer. Examples of conductive materials include permalloy, gold, silver, copper, and tin. Subsequent processing steps form components, contacts and/or conductive lines on the wafer.

In some electroplating processors, a current thief electrode is used to better control the plating thickness at the edge of the wafer and for control of the terminal effect on thin seed layers. The terminal effect for a given seed layer increases as the electrical conductivity of the electrolyte bath increases. Hence, a current thief electrode can be effectively used with thinner seed layers combined with high conductivity electrolyte baths. The use of thin seed layers is increasingly common with redistribution layer (RDL) and wafer level packaging (WLP) plated wafers.

Uniformity of electroplated materials across the wafer is important and becomes more and more important as device characteristic dimensions shrink and/or wafers increase in size. Accordingly, engineering challenges remain in designing apparatus and methods for electroplating wafers, and other applications, using a thief electrode.

BRIEF SUMMARY

Embodiments of the present technology may permit dynamic control of electroplating at the edge of the wafer. Dynamic control may be possible through using a plurality of thief electrodes, at least some of which are distributed to provide thief current channels at the edge of the wafer. The currents to the thief electrodes may be adjusted independently based on the rotation of the wafer. The electroplating thickness and other properties may be adjusted for certain features at the wafer edge, including the wafer notch, wafer scribe, or certain patterned structures. As a result, electroplating thickness and quality may be more uniform at the wafer edge. Yield, performance, and/or reliability of devices may be improved. Wafer level packaging (WLP) may be improved.

Embodiments of the present technology may include an electroplating system. The electroplating system may include a vessel. The system may also include a wafer holder configured for holding a wafer in the vessel. The system may further include an anode in the vessel. In addition, the method may include a plurality of thief electrodes. For each thief electrode of the plurality of thief electrodes, a thief current channel may be defined by a channel wall. The channel wall for each thief electrode may define an aperture adjacent to the wafer holder. The thief current channel may extend from each thief electrode to the aperture. The system may include a current control system in electrical communication with the plurality of thief electrodes. The current control system may be configured such that an amount of current delivered to each thief electrode can be adjusted independently.

Embodiments of the present technology may include an electroplating system, the electroplating system may include a catholyte. The catholyte may include metal ions. The system may include a wafer holder configured for holding a wafer in contact with the catholyte and for rotating the wafer. The system may further include an anode. In addition, the system may include a plurality of thief electrodes. Each thief electrode may be disposed in a thiefolyte. The thief current channel for each thief electrode may be defined by a channel wall. The channel wall may define an aperture adjacent to the wafer holder. The thief current channel may extend from each thief electrode to each respective aperture. The system may also include a current control system in electrical communication with the plurality of thief electrodes. The current control system may be configured such that an amount of current delivered to each thief electrode can be adjusted independently based on the rotational position of the wafer.

Embodiments may include a method of plating a semiconductor wafer. The method may include contacting a wafer on a wafer holder with a first electrolyte. The first electrolyte may include metal ions. The method may also include rotating the wafer. The method may further include electrochemically plating metal onto the wafer using the metal ions. The plating may be by applying an anode current to an anode. The plating may also include applying a plurality of current amounts to a plurality of thief electrodes. Each thief electrode of the plurality of thief electrodes may be disposed in a second electrolyte in a thief current channel. Applying the plurality of current amounts may result in a non-uniform current density around the edge of the wafer.

A better understanding of the nature and advantages of embodiments of the present invention may be gained with reference to the following detailed description and the accompanying drawings.

DETAILED DESCRIPTION

Semiconductor wafer, and in particular, wafer level packaging (WLP) substrates may have non-uniform, un-patterned areas near the edge of the wafer. These areas may result from rectangular-shaped die patterns not fitting perfectly within a round substrate. This patterning may lead to variations in the active plating area around the wafer perimeter. Conventional methods may use dummy bumps or partial die patterns to mitigate these edge variations. However, partial die patterns may still exhibit circumferential edge variations. In addition, regions near the notch or wafer scribe may be covered with photoresist to avoid plating in this region. The un-patterned notch or scribe area may vary in size and shape.

Other systems and methods for electroplating may not dynamically adjust current densities at the edge of the wafer. Dynamically adjusting the current at the edge of the wafer may provide for more uniform and higher quality electroplating at the edge. Variations in the wafer may be addressed through adjusting currents at thief electrodes based on the rotation of the wafer. For example, a certain higher or lower current amount may be targeted for any thief electrode as a certain feature (e.g., notch or scribe) of the wafer passes near the thief electrode.

I. Electroplating

Figure 1:
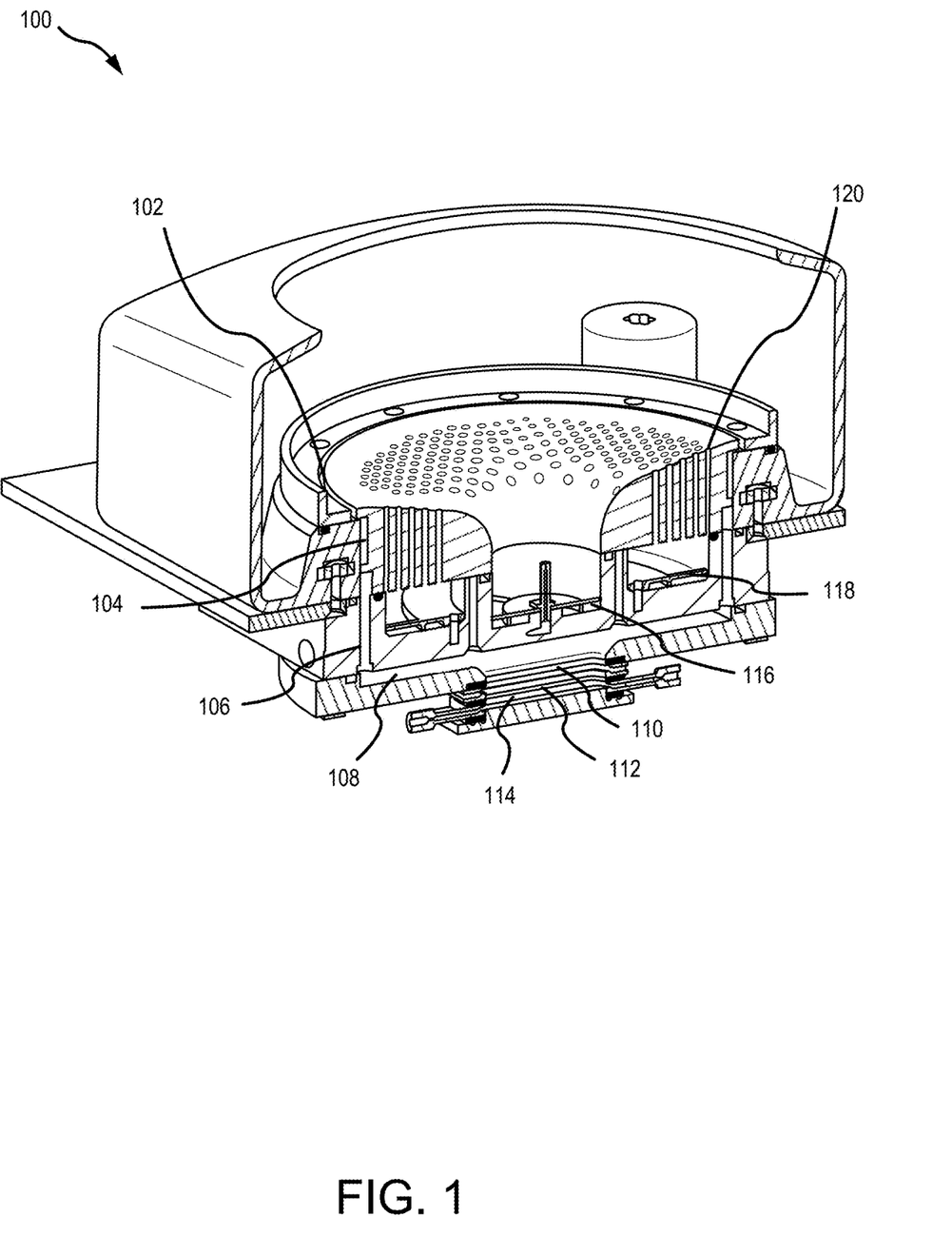
FIG. 1 shows an electroplating system chamber according to embodiments of the present technology.

Electroplating systems may include a vessel or chamber 100 as shown in FIG. 1. Chamber 100 uses a virtual edge thief opening 102 to yield a substantially uniform circumferential thief profile. Virtual edge thief opening 102 would be beyond the edge of a wafer. Virtual edge thief opening 102 is connected with upper thief path 104, which is a continuous ring. For 300 mm diameter wafers, the diameter of upper thief path 104 may be greater than 310 mm, for example, 320, 330, 340, or 350 mm. Upper thief path 104 is connected to lower thief path 106, which include 32 discrete tubes. Lower thief path 106 is connected to open cylinder 108. Open cylinder 108 then leads to the thief electrode assembly of upper thief membrane 110, lower thief membrane 112, and single thief electrode 114. Upper thief path 104, lower thief path 106, and open cylinder 108 may conduct the electric field created by thief electrode 114 to virtual edge thief opening 102.

Upper thief membrane 110 may separate a catholyte from an isolyte. A catholyte may be solution of sulfuric acid and deionized water. The catholyte may include metal ions that are converted to the plated metal on the wafer. Metal ions may include those from nickel, tin, silver, and gold. The plated metal may include nickel, tin silver (SnAg), or gold. A catholyte for copper plating may include sulfuric acid, copper sulfate, and water. In some instances, methylsulfonic acid may be used in place of or in addition to sulfuric acid.

Lower thief membrane 112 may separate isolyte from thiefolyte. The isolyte is an electrolyte that may provide an isolation function and may reduce the amount of metal ions that are carried into the thiefolyte. The isolyte may be a sulfuric acid and deionized water solution and may be the same liquid as the anolyte. The membranes may reduce or avoid metal deposition onto the thief electrodes. The membranes may be cationic or anionic membranes. The membranes may be Nafion, polymeric membranes, cellulose acetate, nitrocellulose, cellulose esters, polysulfone, polyether sulfone, polyacrilonitrile, polyamide, polyimide, polyethylene and polypropylene, polytetrafluoroethylene, polyvinylidene fluoride, polyvinylchloride, or any suitable membrane material. The thiefolyte lessens metal deposition onto the thief electrode by no including metal ions. The thiefolyte may include or be dilute sulfuric acid. The thief electrodes may not need to be deplated or replaced as frequently.

First anode 116 and second anode 118 may be include inert material. For example, first anode 116 and second anode 118 may be platinum clad wires within Nafion membrane tubes. Chamber 100 may include one or more second anodes 118. The anode current from these anodes may be distributed through discrete vertical tubes to upper cup 120. Upper cup 120 may be an engineered funnel shape.

Figure 2:
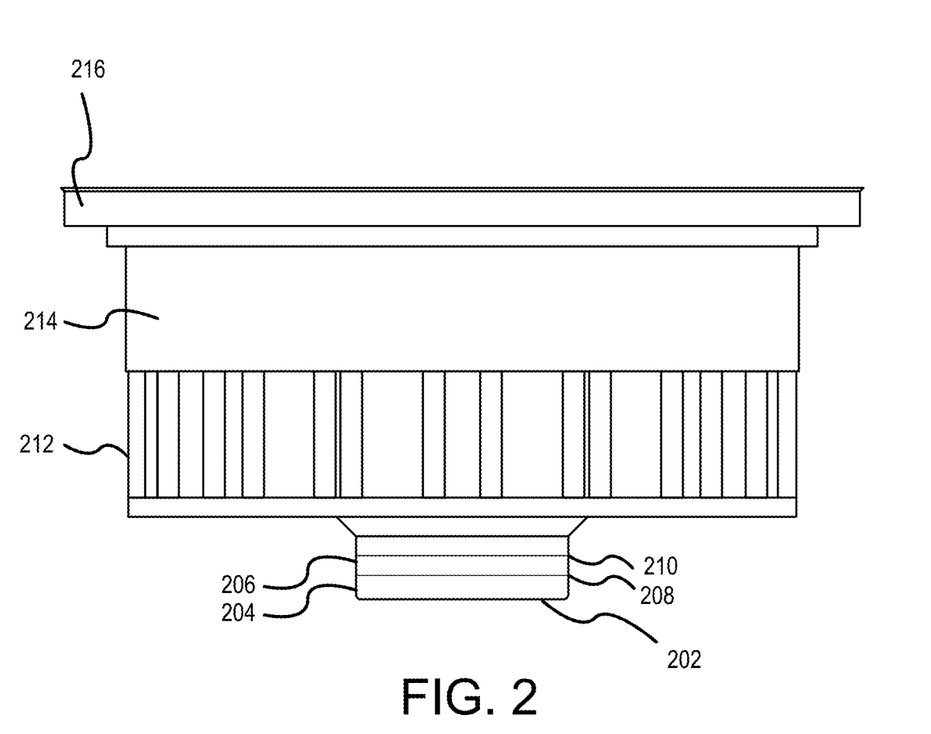
FIG. 2 shows a view of a portion of an electroplating system chamber according to embodiments of the present technology.

FIG. 2 shows a view of portions of the chamber 100. Thief electrode 202 is disposed in a thiefolyte 204. Thiefolyte 204 is separated from isolyte 206 by membrane 208. Isolyte 206 is separate from a catholyte by membrane 210. Discrete tubes 212 form thief current channels up to open ring 214. Discrete tubes 212 may be lower thief path 106. Open ring 214 may be upper thief path 104. Upper thief path 104 may include the catholyte. The wafer may be held in section 216. Thief electrode 202 may be near or at the centerline of chamber 100, so that the thief current flows radially outward and up to or above the level of the wafer. As a result of the single thief electrode 202 and the uniform distribution of the thief current around the wafer, the current density may be uniform around the circumference of the wafer.

A uniform current density around the circumference of the wafer may not be desired because the wafer or patterned structures on the wafer are not uniform around the circumference. Embodiments of the present technology provide systems and methods to intentionally and predictably create a non-uniform current density around the circumference of the wafer.

II. Systems

Systems of the present technology may include using a plurality of thief electrodes instead of a single thief electrode. Embodiments of the present technology may include an electroplating system. The electroplating system may be similar to chamber 100. The electroplating system may include a vessel, which may be similar to chamber 100. The vessel may contain an electrolyte containing metal ions. The electrolyte may be a catholyte, including any catholyte described herein. The metal ions may include copper, tin, silver, or gold ions.

The system may also include a wafer holder configured for holding a wafer in the vessel. The wafer holder may be positioned opposite upper cup 120 so that the wafer is facing upper cup 120. The wafer may be in contact with the electrolyte in the vessel. The wafer holder may be configured to rotate the wafer. The wafer may rotated from 1 to 3 rpm, from 3 rpm to 10 rpm, from 10 rpm to 20 rpm, from 20 rpm to 30 rpm, or from 30 rpm to 60 rpm. The direction of rotation may be changed periodically. Paddles present in the vessel may agitate the electrolyte in the vessel. The system may further include an anode or anodes in the vessel. The anode or anodes may include first anode 116 and second anode 118.

Figure 3A:
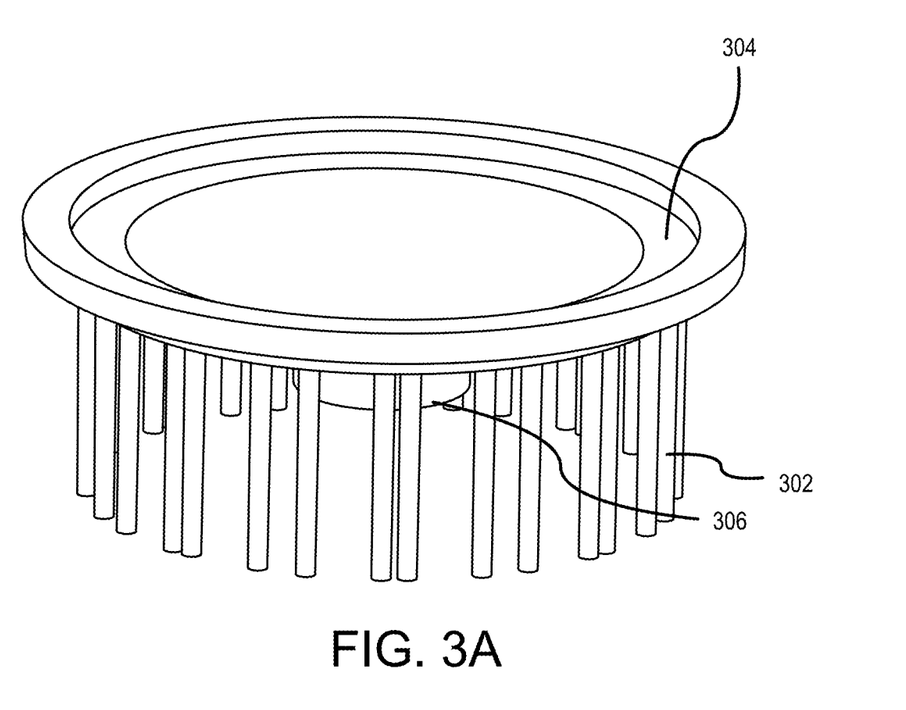
FIGS. 3A and 3B show independent thief sources in a system according to embodiments of the present technology.
Figure 3B:
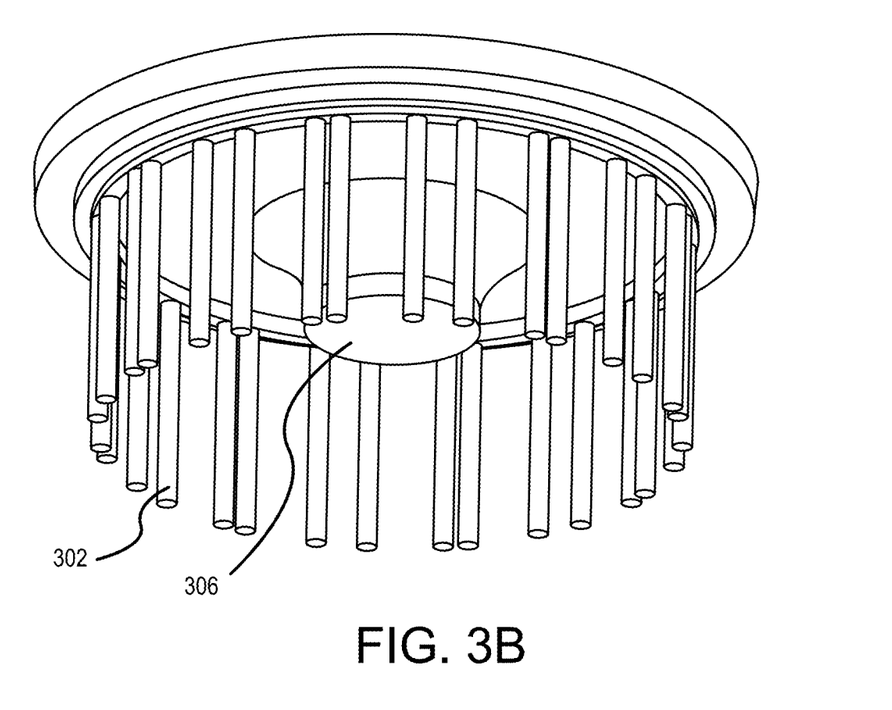

A key difference with FIG. 1 is that the system may include a plurality of thief electrodes instead of a single thief electrode. FIGS. 3A and 3B show independent thief sources 302. The thief electrodes may be within independent thief sources 302. The plurality of thief electrodes may be equidistant from a point on a plane defined by the wafer when the wafer is in contact with the wafer holder and undergoing plating. For example, the plurality of thief electrodes may be equidistant from the center of the wafer. Equidistant may be measured from the center of mass of each thief electrode. In some examples, the center of mass of the plurality of thief electrodes may be the center of a circle circumscribed by the plurality of thief electrodes. In other words, the thief electrodes may be disposed in a circle.

The thief electrodes may be distributed non-uniformly around the circle. FIGS. 3A and 3B show a non-uniform distribution of the independent thief sources 302 and hence of the thief electrodes. The non-uniform distribution of the thief electrodes and independent thief sources 302 may allow for better electrolyte flow through independent thief sources 302. The electrolyte that flows through independent thief sources 302 may be an anolyte. The same electrolyte may be used in the membrane tubes containing the thief electrodes and the membrane tubes containing the anode electrodes. Oxygen may be generated at an inert anode (e.g., Pt wire). Hydrogen may be generated at an inert thief (e.g., Pt wire).

The plurality of thief electrodes may include from 2 to 10 electrodes, from 11 to 20 electrodes, from 21 to 30 electrodes, from 31 to 40 electrodes, or more than 40 electrodes, including 2, 3, 4, 5, 6, 7, 8, 9, 10, 30, 31, 32, or 33 electrodes. Each thief electrode may be disposed in an electrolyte. The electrolyte may be a thiefolyte.

For each thief electrode of the plurality of thief electrodes, a thief current channel may be defined by a channel wall. The channel wall is visible for independent thief sources 302 in FIGS. 3A and 3B. The channel wall for each thief electrode may define an aperture adjacent to the wafer holder or the wafer during plating. The apertures may open in area 304 adjacent to where the wafer may be held and adjacent to upper cup 306, which may be the same or similar as upper cup 120. The apertures may be located so that the edge of the aperture is from 1 mm to 2 mm, from 2 mm to 3 mm, from 3 mm to 4 mm, from 4 mm to 5 mm, from 5 mm to 10 mm, or more than 10 mm away from the wafer edge, which may be closer than virtual edge thief opening 102 is to the wafer in FIG. 1. The channel wall may be straight. The thief current channel may extend from each thief electrode to the aperture. The aperture may be a circle, an annulus, or a segment of an annulus. The thief current channel may extend from the thief electrode to a virtual thief position adjacent to the wafer holder. The virtual thief position may be adjacent to the wafer to facilitate plating at the level of the wafer. The thief current channel from the thief electrode to the aperture may be coaxial about a longitudinal axis that is orthogonal to the wafer in the wafer holder. In FIGS. 3A and 3B, this longitudinal axis runs vertically through the center of a cylinder encompassing the independent thief source.

As an example, the plurality of thief electrodes may include a first thief electrode and a second thief electrode. The system may include a first thief current channel and a second thief current channel. The first thief current channel may extend from the first thief electrode. The first current channel may conduct an electric field from the first thief electrode to a position near the level of the wafer. The first thief current channel may be cylindrical, such as independent thief source 302. The second thief current channel may be annular or cylindrical. If the system does not include an annular thief current channel, then upper thief path 104 and open ring 214 may not be included in the system.

In some embodiments, a single thief electrode may feed multiple thief current channels instead of each thief current channel including a separate and independent thief electrode. A wafer may include certain symmetries that may allow for the same or similar thief current at corresponding locations around the wafer. However, a plurality of thief electrodes may still be included. This additional plurality of thief electrodes may feed one or more thief current channels and may be any thief electrodes described herein.

A. Thief Electrode Configurations

Figure 4A:
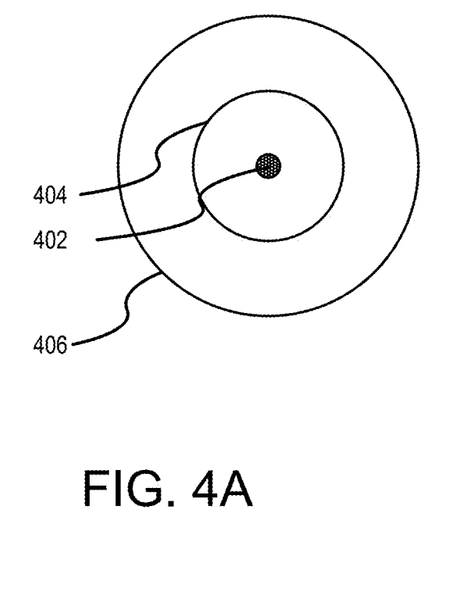
FIGS. 4A and 4B show a configuration of a thief electrode according to embodiments of the present technology.
Figure 4B:
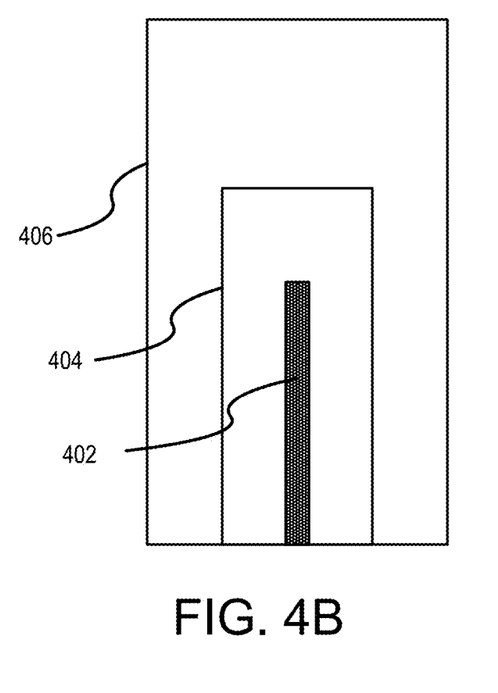

Thief electrodes may be include different configurations, which may be used in combination with other configurations or may be the only configuration. FIGS. 4A and 4B show a configuration where the thief electrode may include a metal wire 402 disposed in a tubular membrane 404. Metal wire 402 may be a platinum wire. Metal wire 402 may be from 2 cm to 3 cm long, from 3 to 4 cm long, from 4 to 5 cm long, from 5 to 6 cm long, from 6 to 7 cm long, from 7 to 8 cm long, from 8 to 9 cm long, or from 9 to 10 cm long. In some instances, a metal mesh may be used in place of metal wire 402.

Tubular membrane 404 may be disposed in a thief current channel, defined by channel wall 406. The channel wall may be cylindrical. Channel wall 406, tubular membrane 404, and metal wire 402 may be coaxial about a longitudinal axis. The thiefolyte may be disposed between 402 metal wire and tubular membrane 404. An isolyte may be disposed between tubular membrane 404 and channel wall 406. An additional membrane may be included to separate the isolyte from the catholyte. Any membranes used may be small, making sealing around the membranes easier. The current thief electrode may have a relatively small diameter (e.g. an effective diameter less than about 140 mm, 120 mm, or 100 mm). A plurality of thief electrodes may be in the configuration illustrated in FIGS. 4A and 4B.

Figure 5A:
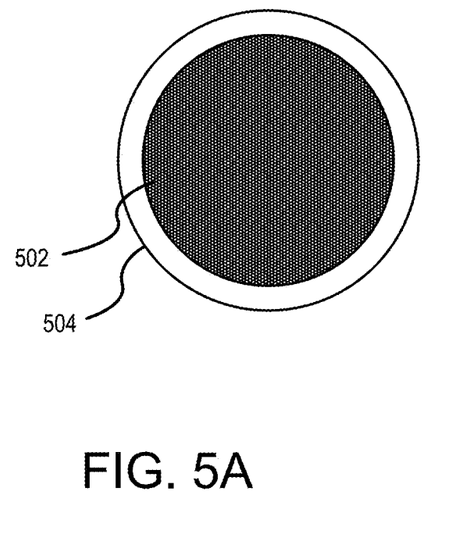
FIGS. 5A and 5B show a configuration of a thief electrode according to embodiments of the present technology.
Figure 5B:
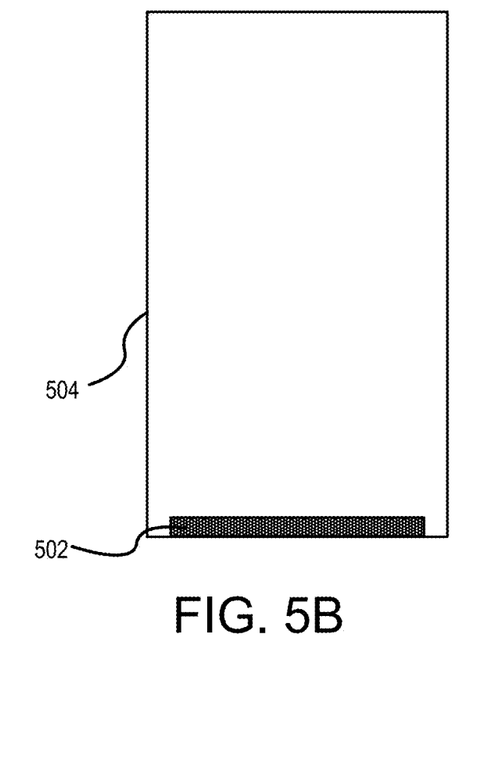

FIGS. 5A and 5B show a thief electrode that may include a metal disc 502 disposed at an end of thief current channel 504 distal to the wafer holder. Metal disc 502 may be in a thiefolyte. Metal disc 502 may be replaced by a metal mesh. A membrane may separate the thiefolyte from an isolyte. A second membrane may separate the isolyte from the catholyte. A plurality of thief electrodes may be in the configuration illustrated in FIGS. 5A and 5B.

Figure 6A:
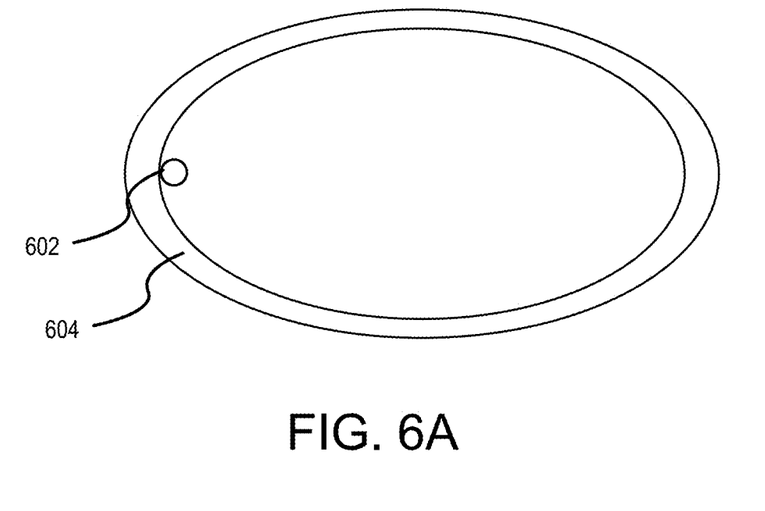
FIG. 6A shows a configuration of a thief current channels according to embodiments of the present technology.

FIG. 6A shows a configuration including both a cylindrical thief current channel 602 and an annular thief current channel 604. Cylindrical thief current channel 602 may include configurations shown in FIGS. 4A, 4B, 5A, and 5B. Annular thief current channel 604 may be similar to upper thief path 104 or open ring 214. Annular thief current channel 604 may lead to a single thief electrode similar to single thief electrode 114 or thief electrode 202. The thief current path in thief current channel 604 may provide a uniform current density around the circumference of the wafer. The thief current path from thief current channel 602 may provide a non-uniform current density around the circumference of the wafer. Additional thief current channels that may provide for non-uniform current densities around the circumference of the wafer may be included. In some embodiments, thief current channel 602 may be outside of thief current channel 604. The thief current through thief current channel 602 may be adjusted independently of the thief current through thief current channel 604.

Figure 6B:
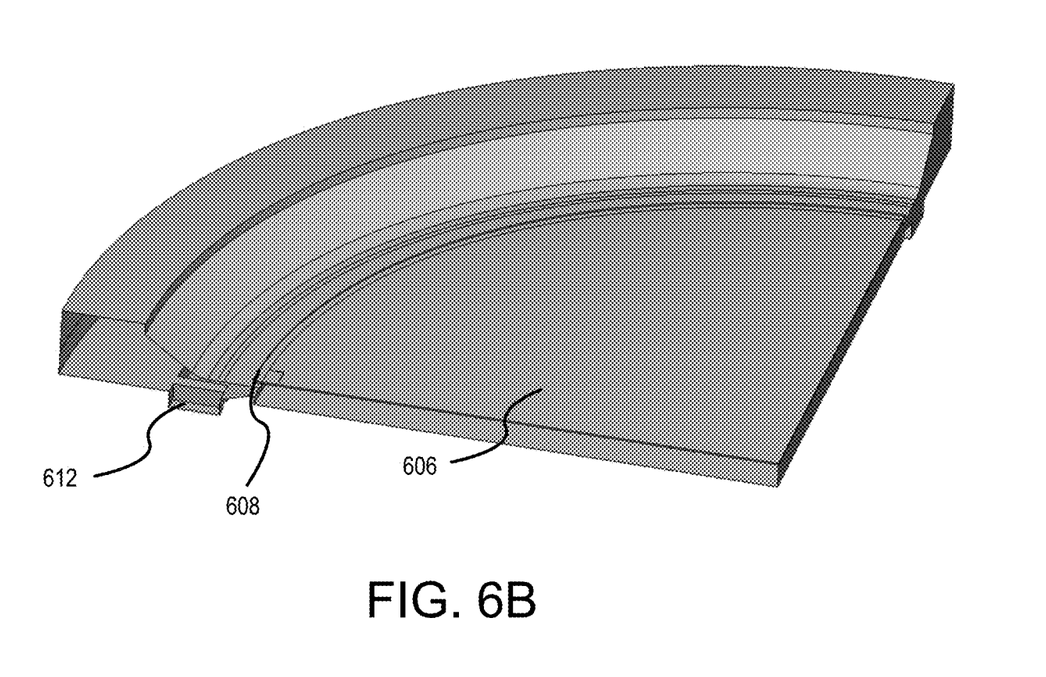
FIGS. 6B, 6C, and 6D show a configuration of thief current channels and thief electrodes according to embodiments of the present technology.
Figure 6C:
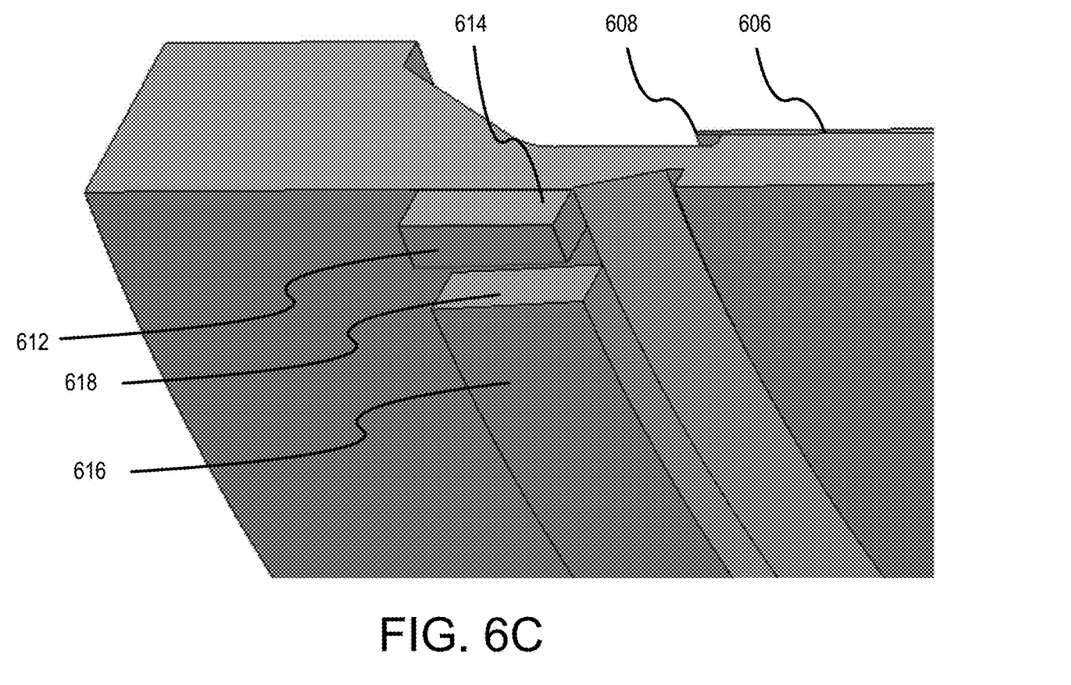
Figure 6D:
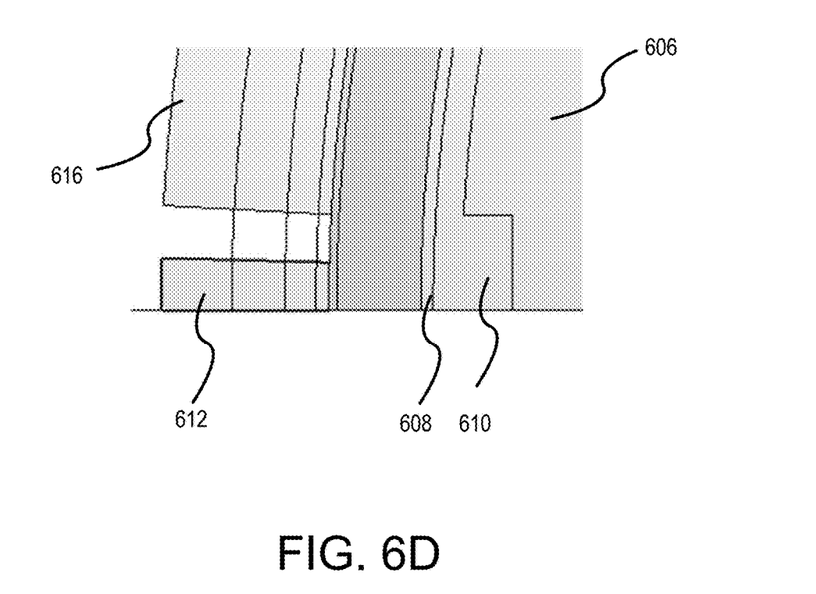

FIGS. 6B, 6C, and 6D show different views of a configuration including two thief electrodes and two thief current channels. Wafer 606 may have wafer edge 608. Wafer scribe 610 may occupy an area with a length of about 6.8 mm and a width of about 16.4 mm. Wafer scribe 610 may be aligned at the same or similar rotational position as a thief electrode 612. Thief electrode 612 may be at the bottom of thief current channel 614. Thief current channel 614 may be from 1 mm to 3 mm, 3 mm to 5 mm, 5 mm to 7 mm, 7 mm to 9 mm, or more than 9 mm deep. Thief current channel 614 may be from 5 mm to 10 mm, from 10 mm to 15 mm, from 15 mm to 20 mm, or over 20 mm wide. Thief electrode 612 may be an arc of a circle. Thief electrode 612 may span from 1 degree to 2 degrees, from 2 degrees to 3 degrees, from 3 degrees to 4 degrees, from 4 degrees to 5 degrees, from 5 degrees to 10 degrees, from 10 degrees to 20 degrees, from 20 degrees to 30 degrees, from 30 degrees to 45 degrees, or 45 degrees or more of a circle. Another electrode, thief electrode 616, may span the remainder of the circle except for some separation from thief electrode 612. The separation between thief electrode 612 and thief electrode 616 may be any degrees described for thief electrode 612. Thief electrode 612 may be separated from thief electrode 616 on both sides, with the separation distance on each side being half the degrees of thief electrode 612. Thief electrode 616 may be at the bottom of a thief current channel 618. Thief current channel 618 may have the same or similar height and width as thief current channel 614. Some embodiments may include more than two thief electrodes, including three, four, five, or six thief electrodes, as arc segments of the same annulus.

Figure 6E:
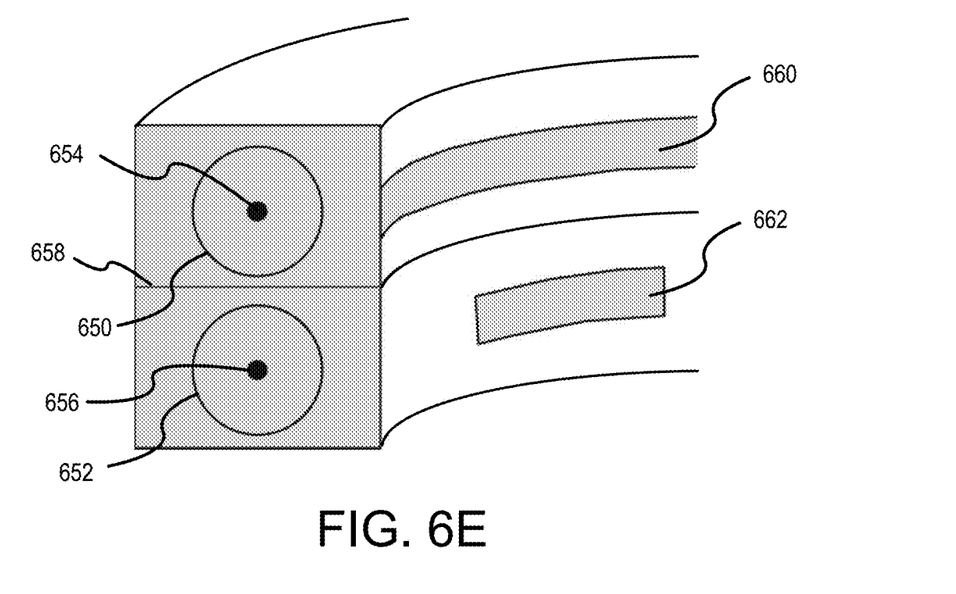
FIG. 6E shows a configuration of thief current channels and thief electrodes according to embodiments of the present technology.

In some embodiments, thief electrodes may be vertically stacked. FIG. 6E shows two annular tubes 650 and 652 with thief electrodes 654 and 656. A plastic wall 658 may isolate tube 650 from tube 652. The inside diameter of the annular channels may define apertures that allow current to flow from the thief electrode to the edge of the wafer. Aperture 660 may be continuously open around the circumference of the wafer. Aperture 662 may be open only locally. Aperture 662 may be used for notch or scribe control. The diameter of each of the annular channels may be larger than the wafer, which would fit inside the channel and rotate. The wafer may be positioned vertically between apertures 660 and 662. In some embodiments, the wafer may be adjusted to be vertically aligned with only one of the apertures and then aligned with the other aperture during portions of a processing recipe.

B. Current Control System

Figure 7:
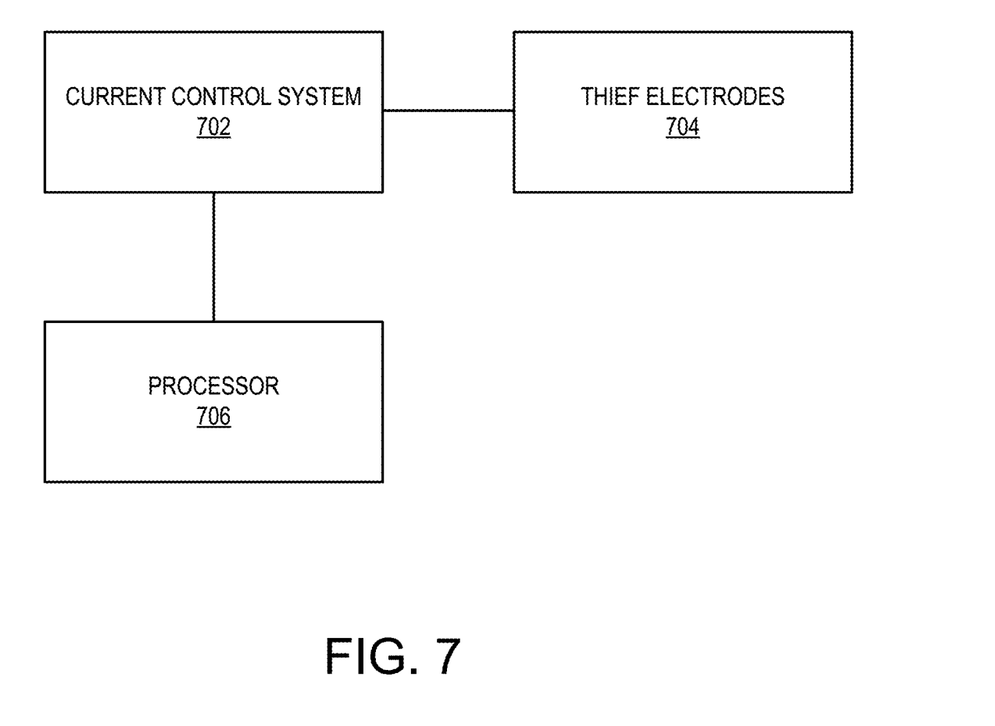
FIG. 7 shows a current control system and assorted connections according to embodiments of the present technology.

FIG. 7 shows a current control system 702. The system may include current control system 702 in electrical communication with the plurality of thief electrodes 704. Current control system 702 may be configured such that an amount of current delivered to each thief electrode can be adjusted independently. The amount of current delivered to each thief electrode may be adjusted through a power supply or power supplies adjusting the current delivered to the thief electrode. In some embodiments, the current may be adjusted through adjusting resistance in a circuit with the thief electrode. Current control system 702 may be configured such that the current at each thief electrode can vary based on a rotational position or orientation of the wafer. The rotational position of the wafer may be known through the stepper position of a stepper motor. A processor 706 may execute instructions that cause current control system 702 to adjust current to thief electrodes 704 based on the stepper position or other rotational position information. Current control system 702 may also be in electrical communication with the anode or a plurality of anodes. The wafer current may be specified. If the thief current or currents increase, the anode current or currents may also increase. Similarly, if the thief current or currents decrease, the anode current or currents may also decrease.

Adjusting the current based on the rotational position of the wafer may have advantages over other configurations of electroplating systems. For example, an electroplating system may include a non-symmetrical virtual thief opening to account for asymmetries in a wafer. However, in this case, rotating the wafer would average out current densities over the entire circumference of the wafer. In addition, a system with a non-symmetrical virtual thief opening may include different rotation speeds as plating progresses to result in non-uniform current densities and plating. Even so, including different rotation speeds may increase process complexity and may unpredictably affect mass transfer of metal from the solution to the wafer. This may result in poorer quality plating compared to independently adjusting current to thief electrodes based on the rotational position of the wafer.

C. Example System

Embodiments of the present technology may include an electroplating system, the electroplating system may include a catholyte. The catholyte may include metal ions. The catholyte may be any catholyte described herein. The system may include a wafer holder configured for holding a wafer in contact with the catholyte and for rotating the wafer. The system may further include an anode. In addition, the system may include a plurality of thief electrodes. The thief electrode may be any thief electrode described herein. Each thief electrode may be disposed in a thiefolyte. The thiefolyte may be any thiefolyte described herein.

The thief current channel for each thief electrode may be defined by a channel wall. The channel wall may define an aperture adjacent to the wafer holder. The thief current channel may extend from each thief electrode to each respective aperture. The thief current channel, channel wall, and aperture may be any described herein.

The system may also include a current control system in electrical communication with the plurality of thief electrodes. The plurality of thief electrodes may be any described herein. The current control system may be configured such that an amount of current delivered to each thief electrode can be adjusted independently based on the rotational position of the wafer. The current control system may be any current control system described herein.

III. Methods

Figure 8:
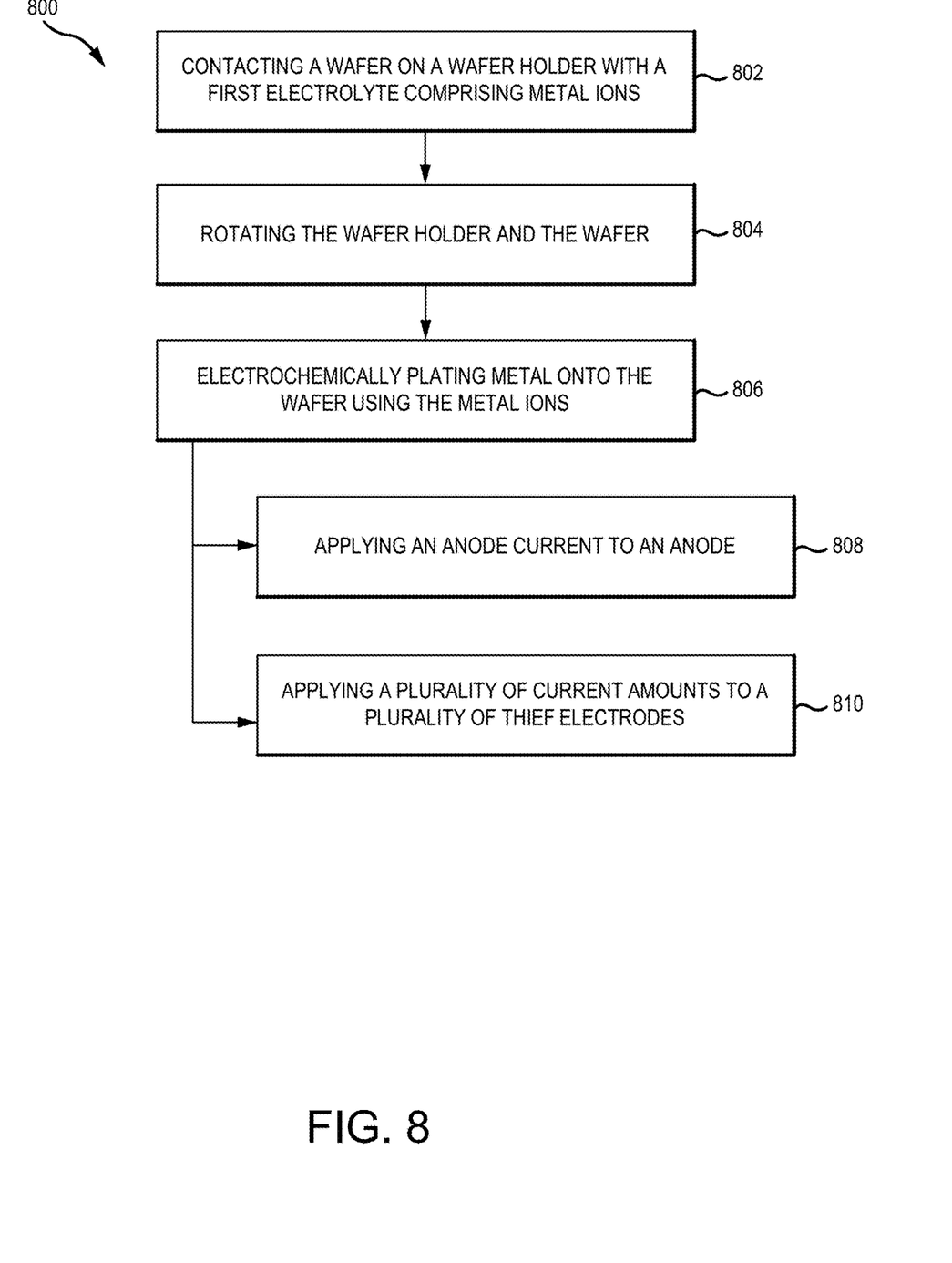
FIG. 8 shows a method of plating a semiconductor wafer according to embodiments of the present technology.

As shown in FIG. 8, embodiments may include a method 800 of plating a semiconductor wafer. At block 802, method 800 may include contacting a wafer on a wafer holder with a first electrolyte. The wafer holder may be any wafer holder described herein. The first electrolyte may include metal ions and may be any catholyte described herein. The wafer may be notch aligned before the wafer is contacted with the first electrolyte. The wafer may be notch aligned in an electroplating system or by another piece of equipment before electroplating.

At block 804, method 800 may also include rotating the wafer. The wafer holder may rotate the wafer. The wafer may be rotated in a variety of ways. The wafer may be rotated continuously at a constant rpm. In some embodiments, the wafer may interrupt an otherwise continuous rotation with a change in rotation direction. The wafer may be rotated with variable rpm. In some embodiments, the wafer may not be rotated but may be positioned at a specified angular position. The wafer may be positioned at a specified angular position for a specified time. The rotation may include any combination of the rotation techniques. In addition, paddles may agitate the catholyte during the plating process to affect mass transfer.

At block 806, method 800 may further include electrochemically plating metal onto the wafer using the metal ions. At block 808, the plating may be done by applying an anode current to an anode. The anode may be any anode or plurality of anodes described herein.

At block 810, the plating may also include applying a plurality of current amounts to a plurality of thief electrodes. The current amounts may be from 0 A to 1 A, from 1 A to 2 A, from 2 A to 3 A, from 3 A to 4 A, from 4 A to 5 A, from 5 A to 6 A, or from 6 A to 10 A. The plurality of thief electrodes may be any described herein. Each thief electrode of the plurality of thief electrodes may be disposed in a second electrolyte in a thief current channel. The second electrolyte may be any thiefolyte or isolyte described herein. One or more of the current amounts of the plurality of current amounts may be based on a rotation of the wafer. The current amount for a given thief electrode may be adjusted to be higher or lower when the wafer notch, wafer scribe, or certain structures are above or not above the given thief electrode. The magnitude of the current amount for a thief electrode when aligned with a wafer notch, wafer scribe, or certain structures may be more from 2 times to 5 times less, from 5 times to 10 times less, from 10 times to 15 times less than a thief electrode not aligned with the wafer notch, wafer scribe, or certain structures. The current amount may be adjusted by a current control system and/or a processor. At some times during plating, current to one or more thief electrodes may be set at zero. In some embodiments, an anode current may be applied to a thief electrode so that the thief electrode acts as an anode.

Applying the plurality of current amounts may result in a non-uniform current density around the edge of the wafer. A non-uniform current density may include a standard deviation of the current density that is greater than 5%, 10%, 15%, 20%, 25%, 30%, or 40% of the mean. The non-uniform current density may allow for a more uniform plating thickness around the edge of the wafer, including at the wafer notch, compared to conventional methods. The mean current density may be from 80 A/m² to 90 A/m², from 90 A/m² to 100 A/m², from 100 A/m² to 110 A/m², from 110 A/m² to 120 A/m², from 120 A/m² to 130 A/m², or greater than 130 A/m². The thickness may have a uniformity with a standard deviation that is within 5%, 10%, 15%, 20%, or 25% of the mean thickness. In embodiments, the maximum or minimum thickness within 1, 2, 3, 4, or 5 degrees of the wafer notch may be within 5%, 10%, 15%, 20%, or 25% of the mean thickness around the edge of the wafer.

IV. Additional System Details

Figure 9:
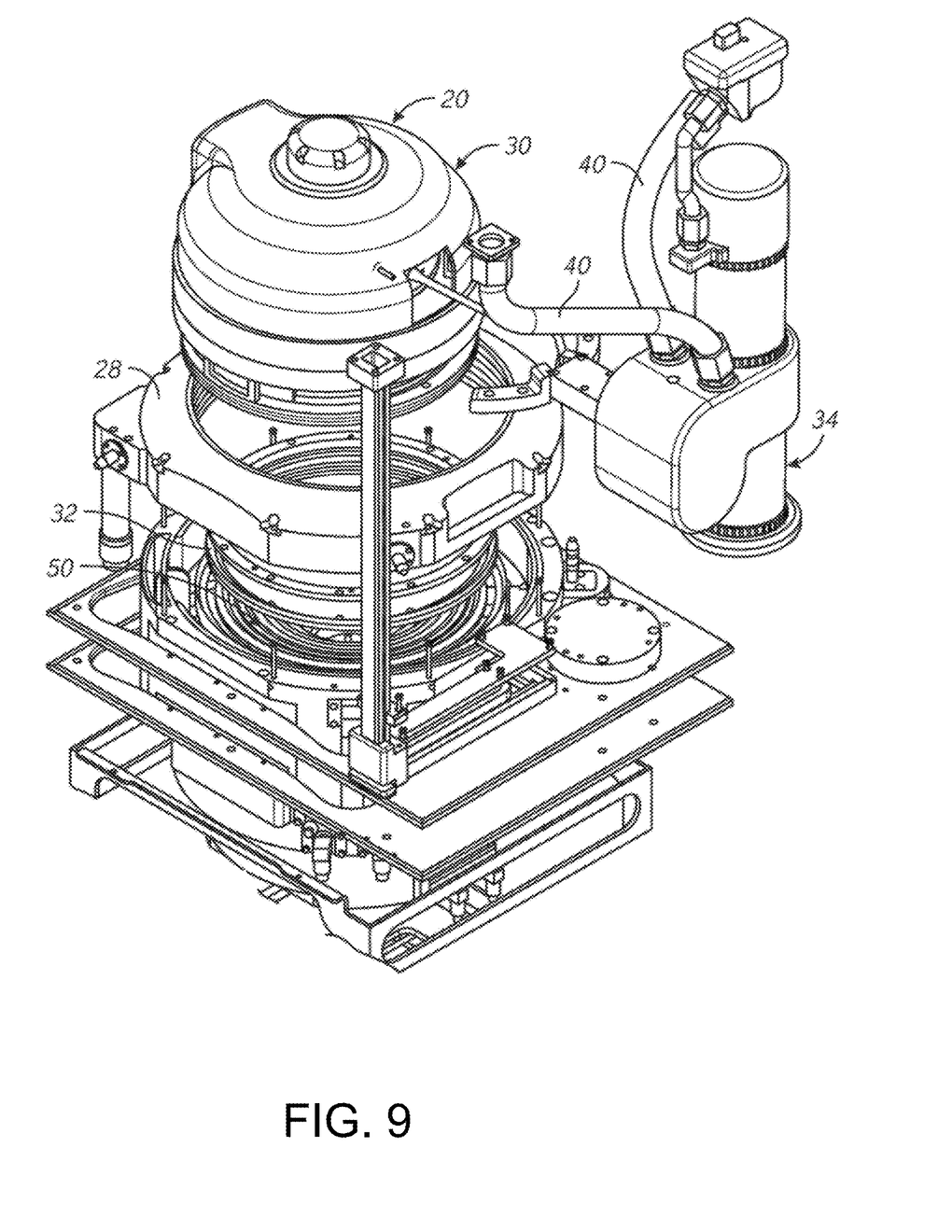
FIG. 9 shows an electroplating system according to embodiments of the present technology

FIG. 9 shows an electroplating system 20. Electroplating system 20 has a head 30 positioned above a vessel assembly 50. A single system 20 may be used as a standalone unit. Alternatively, multiple systems 20 may be provided in arrays, with workpieces loaded and unloaded in and out of the processors by one or more robots. The head 30 may be supported on a lift or a lift/rotate unit 34, for lifting and/or inverting the head to load and unload a wafer into the head, and for lowering the head 30 into engagement with the vessel assembly 50 for processing. Electrical control and power cables 40 linked to the lift/rotate unit 34 and to internal head components lead up from system 20 to facility connections, or to connections within multi-processor automated system. A rinse assembly 28 having tiered drain rings may be provided above the vessel assembly 50. System 20 may include features of electroplating systems described herein, including features of FIGS. 3A, 3B, 4A, 4B, 5A, 5B, and 6.

The specific details of particular embodiments may be combined in any suitable manner without departing from the spirit and scope of embodiments of the invention. However, other embodiments of the invention may be directed to specific embodiments relating to each individual aspect, or specific combinations of these individual aspects.

The above description of example embodiments of the invention has been presented for the purposes of illustration and description. It is not intended to be exhaustive or to limit the invention to the precise form described, and many modifications and variations are possible in light of the teaching above.

In the preceding description, for the purposes of explanation, numerous details have been set forth in order to provide an understanding of various embodiments of the present technology. It will be apparent to one skilled in the art, however, that certain embodiments may be practiced without some of these details, or with additional details.

Having described several embodiments, it will be recognized by those of skill in the art that various modifications, alternative constructions, and equivalents may be used without departing from the spirit of the invention. Additionally, a number of well-known processes and elements have not been described in order to avoid unnecessarily obscuring the present invention. Additionally, details of any specific embodiment may not always be present in variations of that embodiment or may be added to other embodiments.

Where a range of values is provided, it is understood that each intervening value, to the tenth of the unit of the lower limit unless the context clearly dictates otherwise, between the upper and lower limits of that range is also specifically disclosed. Each smaller range between any stated value or intervening value in a stated range and any other stated or intervening value in that stated range is encompassed. The upper and lower limits of these smaller ranges may independently be included or excluded in the range, and each range where either, neither, or both limits are included in the smaller ranges is also encompassed within the invention, subject to any specifically excluded limit in the stated range. Where the stated range includes one or both of the limits, ranges excluding either or both of those included limits are also included.

As used herein and in the appended claims, the singular forms "a", "an", and "the" include plural referents unless the context clearly dictates otherwise. Thus, for example, reference to "a method" includes a plurality of such methods and reference to "the membrane" includes reference to one or more membranes and equivalents thereof known to those skilled in the art, and so forth. The invention has now been described in detail for the purposes of clarity and understanding. However, it will be appreciated that certain changes and modifications may be practice within the scope of the appended claims.

All publications, patents, and patent applications cited herein are hereby incorporated by reference in their entirety for all purposes. None is admitted to be prior art.

What is claimed is:

1. An electroplating system, the electroplating system comprising:
   a vessel;
   a wafer holder configured for holding a wafer in the vessel;
   an anode in the vessel;
   a plurality of thief electrodes, wherein for each thief electrode of the plurality of thief electrodes:
      a thief current channel is defined by a channel wall,
      the channel wall defines an aperture adjacent to the wafer holder,
      the thief current channel extends from the thief electrode to the aperture,
      the thief electrode comprises a metal wire disposed in the respective thief current channel,
      the channel wall is cylindrical, and
      the channel wall and the metal wire are coaxial about a longitudinal axis; and
   a current control system in electrical communication with the plurality of thief electrodes, the current control system configured such that an amount of current delivered to each thief electrode can be adjusted independently.

2. The system of claim 1, wherein:
the plurality of thief electrodes comprises a first thief electrode and a second thief electrode,
the system comprises a first thief current channel and a second thief current channel,
the first thief current channel extends from the first thief electrode,
the second thief current channel extends from the second thief electrode,
the first thief current channel is cylindrical, and
the second thief current channel is annular.

3. The system of claim 1, wherein:
the plurality of thief electrodes comprises a first thief electrode and a second thief electrode,
the system comprises a first thief current channel and a second thief current channel,
the first thief current channel extends from the first thief electrode,
the second thief current channel extends from the second thief electrode,
the first thief current channel is cylindrical, and
the second thief current channel is cylindrical.

4. The system of claim 1, wherein:
the plurality of thief electrodes are equidistant from a point on a plane defined by the wafer when the wafer is in contact with the wafer holder, and
the plurality of thief electrodes comprises three thief electrodes.

5. The system of claim 1, wherein:
for each thief electrode of the plurality of thief electrodes:
the metal wire is disposed in a tubular membrane,
the tubular membrane is disposed in the thief current channel, and
the channel wall, the tubular membrane, and the metal wire are coaxial about the longitudinal axis.

6. The system of claim 5, wherein:
the vessel contains a first electrolyte comprising metal ions,
each thief electrode of the plurality of thief electrodes is disposed in a thiefolyte,
the thiefolyte is disposed between the metal wire and the tubular membrane, and
an isolyte is disposed between the tubular membrane and the channel wall.

7. The system of claim 1, wherein:
the wafer holder is configured to rotate the wafer, and
the current control system is configured such that the amount of current at each thief electrode can vary based on a rotational position of the wafer.

8. The system of claim 1, wherein:
the plurality of thief electrodes are disposed in a circle, and
the plurality of thief electrodes are distributed non-uniformly around the circle.

9. The system of claim 1, wherein for each thief electrode of the plurality of thief electrodes:
the thief current channel extends from the thief electrode to a virtual thief position adjacent to the wafer holder.

10. The system of claim 1, wherein for each thief electrode of the plurality of thief electrodes:
the aperture is a circle, and
an edge of the aperture is disposed at least 1 mm away from the wafer held in the wafer holder during plating.

11. The system of claim 1, wherein for each thief electrode for the plurality of thief electrodes:
the longitudinal axis is orthogonal to a plane of the wafer when held by the wafer holder.

12. An electroplating system, the electroplating system comprising:
a catholyte comprising metal ions;
a wafer holder configured for holding a wafer in contact with the catholyte and for rotating the wafer;
an anode;
a plurality of thief electrodes, wherein for each thief electrode of the plurality of thief electrodes:
the thief electrode is disposed in a thiefolyte,
a thief current channel is defined by a channel wall,
the channel wall defines an aperture adjacent to the wafer holder,
the channel wall is cylindrical,
the channel wall and the thief electrode are coaxial about a longitudinal axis, and
the thief current channel extends from the thief electrode to the aperture; and
a current control system in electrical communication with the plurality of thief electrodes, the current control system configured such that an amount of current delivered to each thief electrode can be adjusted independently based on a rotational position of the wafer.

13. The electroplating system of claim 12, wherein each thief electrode of the plurality of thief electrodes comprises a metal wire.

14. The system of claim 13, wherein for each thief electrode of the plurality of thief electrodes:
the metal wire is from 2 cm to 10 cm long.

15. The system of claim 12, wherein for each thief electrode of the plurality of thief electrodes:
the thief electrode is disposed in a tubular membrane,
the tubular membrane is disposed in the thief current channel, and
the channel wall, the thief electrode, and the tubular membrane are coaxial about the longitudinal axis.

16. The system of claim 15, wherein for each thief electrode of the plurality of thief electrodes:
the thiefolyte is disposed between the thief electrode and the tubular membrane, and
an isolyte is disposed between the tubular membrane and the channel wall.

17. The system of claim 12, wherein the plurality of thief electrodes are disposed in a circle.

18. The system of claim 12, wherein for each thief electrode of the plurality of thief electrodes:
the aperture is a circle, and
an edge of the aperture is disposed at least 1 mm away from the wafer held in the wafer holder during plating.

* * * * *